(12) United States Patent
Börger et al.

(10) Patent No.: US 11,955,610 B2
(45) Date of Patent: Apr. 9, 2024

(54) METHOD FOR CATEGORIZING A BATTERY, BATTERY, BATTERY RECYCLING SYSTEM, AND MOTOR VEHICLE

(71) Applicant: VOLKSWAGEN AKTIENGESELLSCHAFT, Wolfsburg (DE)

(72) Inventors: Alexander Börger, Flechtorf (DE); Jan Mertens, Braunschweig (DE)

(73) Assignee: VOLKSWAGEN AKTIENGESELLSCHAFT (DE)

( * ) Notice: Subject to any disclaimer, the term of this patent is extended or adjusted under 35 U.S.C. 154(b) by 370 days.

(21) Appl. No.: 17/171,619

(22) Filed: Feb. 9, 2021

(65) Prior Publication Data

US 2021/0249704 A1 Aug. 12, 2021

(30) Foreign Application Priority Data

Feb. 11, 2020 (DE) ...................... 10 2020 201 697.6

(51) Int. Cl.
*H01M 10/48* (2006.01)
*H01M 10/42* (2006.01)

(52) U.S. Cl.
CPC ..... *H01M 10/482* (2013.01); *H01M 10/4207* (2013.01); *H01M 2220/20* (2013.01)

(58) Field of Classification Search
CPC ........... H01M 10/482; H01M 10/4207; H01M 2220/20
See application file for complete search history.

(56) References Cited

U.S. PATENT DOCUMENTS

| | | |
|---|---|---|
| 10,801,900 B2 | 10/2020 | Poirier |
| 2007/0108946 A1 | 5/2007 | Yamauchi et al. |
| 2015/0268308 A1 | 9/2015 | Nakayama et al. |
| 2016/0018345 A1 | 1/2016 | Park et al. |
| 2019/0212391 A1 | 7/2019 | Koller et al. |

(Continued)

FOREIGN PATENT DOCUMENTS

| | | |
|---|---|---|
| CN | 106324516 A | 1/2017 |
| CN | 108574124 A | 9/2018 |
| DE | 102008010971 A1 | 8/2009 |

(Continued)

OTHER PUBLICATIONS

Hong et al.; Big-Data-Based Thermal Runaway Prognosis of Battery Systems for Electric Vehicles; Energies; 2017; vol. 10, No. 7.

(Continued)

*Primary Examiner* — James Lee
(74) *Attorney, Agent, or Firm* — Barnes & Thornburg LLP

(57) ABSTRACT

A method to categorize a battery with respect to its further handling suitability, wherein safety-relevant and lifetime-relevant operating variables are registered for at least one battery cell of the battery in operation of the battery. By a two-operation evaluation of at least one of the operating variables and/or of a computed variable derived therefrom, a categorization variable is determined. A safety variable is derived and compared to an assigned threshold value, and in response to the threshold value or one of the possibly multiple threshold values having fallen below, a failure prognosis is prepared by the lifetime-relevant operating variables. The categorization variable is determined based on the failure prognosis.

11 Claims, 4 Drawing Sheets

(56) References Cited

U.S. PATENT DOCUMENTS

2020/0249280 A1      8/2020    Myung et al.

FOREIGN PATENT DOCUMENTS

| | | |
|---|---|---|
| DE | 102015101969 A1 | 9/2015 |
| DE | 102015110961 A1 | 1/2016 |
| DE | 102016211898 A1 | 1/2018 |
| DE | 112016002067 T5 | 1/2018 |
| DE | 102016220860 A1 | 4/2018 |
| EP | 3680675 A1 | 7/2020 |
| JP | 2017134894 A | 8/2017 |
| KR | 20150049557 A | 5/2015 |
| WO | 2016200319 A1 | 12/2016 |
| WO | 2019050279 A1 | 3/2019 |

OTHER PUBLICATIONS

Sun et al.; Real-time fault diagnosis method of battery system based on Shannon entropy; Energy Procedia; May 2017; pp. 2354-2359; vol. 105.

Zheng et al.; Lithium ion battery pack power fade fault identification based on Shannon entropy in electric vehicles; Journal of Power Sources; 2013; pp. 136-146; vol. 223 [Accessable on sciencedirect.com].

METHOD FOR CATEGORIZING A BATTERY, BATTERY, BATTERY RECYCLING SYSTEM, AND MOTOR VEHICLE

PRIORITY CLAIM

This patent application claims priority to German Patent Application No. 10 2020 201 697.6, filed 11 Feb. 2020, the disclosure of which is incorporated herein by reference in its entirety.

SUMMARY

Illustrative embodiments relate to a method for categorizing a battery with respect to its further handling suitability. Furthermore, illustrative embodiments relate to a battery, in particular, a battery for a transportation vehicle. Moreover, illustrative embodiments also relate to a transportation vehicle having such a battery. Furthermore, illustrative embodiments relate to a battery utilization system.

BRIEF DESCRIPTION OF THE DRAWINGS

Exemplary embodiments are explained in greater detail with reference to the drawings, in which.

Figure 1:
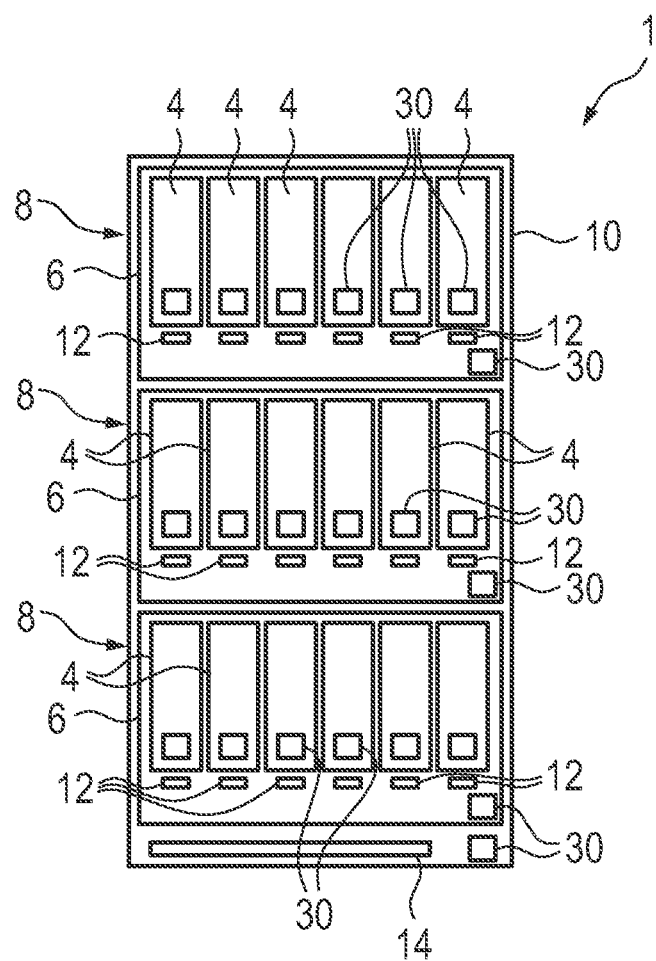
FIG. 1 shows a schematic view of a battery having a plurality of battery modules assembled from multiple battery cells.

Parts and options corresponding to one another are always provided with identical reference signs in all figures.

DETAILED DESCRIPTION

The progressing electrification of transportation vehicles requires, in particular, due to comparatively longer ranges desired on the part of its customers, the use of large batteries—in particular, in terms of their (storage) capacity. These are typically formed by a plurality of battery cells (typically so-called secondary cells) assembled into battery modules. These are usually lithium-ion cells, which are presently beneficial due to their energy density.

The batteries—also referred to as "traction batteries"—are designed, on the one hand, with respect to an achievable range and, on the other hand, for a lifetime considered to be expedient—frequently measured on a number of charging cycles. After reaching their lifetime, the batteries can optionally be supplied to a second use—for example, as buffers in charging stations or the like—or a further utilization by recycling of the materials. In particular, to also avoid damage to the battery, for example, to individual cells, or with respect to the question whether the battery is to be supplied to a second use or further utilization, it is thus expedient to monitor and judge the battery accordingly.

For example, a recycling mode is known from CN 106324516 A, in which a battery management system of the battery recognizes whether the battery is to be recycled. The ascertained battery state and items of information on the battery are automatically transmitted here to a recycling location.

A battery inspection aid is known from DE 10 2015 110 961 A1, which contains a label having a temperature-sensitive section, which indicates temperature changes, and a load-sensitive section, which indicates position changes. During the inspection of the battery, changes in a temperature of the battery can be recognized on the basis of the temperature-sensitive section of the label and changes in a load of the battery can be recognized on the basis of the load-sensitive section of the label.

The disclosed embodiments improve the categorization of a battery with respect to its further handling suitability.

This is achieved by a battery, a battery utilization system, and a transportation vehicle.

The disclosed method is used for categorizing a battery, in particular, a traction battery of a transportation vehicle, with respect to its further handling suitability. The battery may include at least one battery cell (in particular, a secondary cell, i.e., a rechargeable cell), optionally multiple such battery cells.

According to the method, in operation of the battery, a variety of safety-relevant and lifetime-relevant operating variables are registered for at least one battery cell of the battery. By a two-operation evaluation of at least one of the operating variables and/or of a computed variable derived therefrom, a categorization variable is then determined. For this purpose, in a first operation, a safety variable is derived for at least one safety-relevant operating variable and compared to an associated threshold value. For the case in which the threshold value or at least one of the possibly multiple threshold values is fallen below (by the safety variable), in a second operation a failure prognosis is prepared by a plurality of the lifetime-relevant operating variables. The categorization variable is then determined on the basis of the failure prognosis.

Optionally, for the case in which the threshold value or one of the possibly multiple threshold values is exceeded, a recycling category is assigned for the battery, i.e., in particular, a recycling recommendation, i.e., a recommendation for a material utilization of the battery, is output.

The failure prognosis prepared on the basis of the lifetime-relevant operating variables is also referred to as the "performance" or "durability" variable, i.e., "performance variable" or "durability variable".

Because a two-operation process is used for the categorization, in which safety facets, on the one hand, and lifetime facets, on the other hand, are taken into consideration, a high or expedient "resolution" in the consideration of the further handling options can be enabled in a simple manner. This is because if safety criteria are not met, experience has shown that these are prioritized over lifetime facets. A joint consideration or mixing of safety-relevant and lifetime-relevant facets, which can result in inaccuracies in the evaluation, therefore does not take place. A comparatively high informative power of the categorization is thus enabled.

The terms "falling below threshold value or limiting value" are to be understood here and hereinafter to mean that the difference of the safety variable (or also the categorization variable) and the threshold value or limiting value does not change the sign. In contrast thereto, "exceeding" is always to be understood as direction-independent in the meaning that this difference changes its sign.

Optionally, the method described here and hereinafter is carried out by a battery management system of the battery, a database provided by the producer of the battery or a system including the battery, optionally a transportation vehicle, and/or a service location downstream of the manufacturing (for example, a repair shop, a recycling company, or the like).

The conjunction "and/or" is to be understood here and hereinafter in such a way that the features linked by this conjunction can be formed both jointly and also as alternatives to one another.

In at least one disclosed method, in the first operation, a so-called history variable is ascertained for at least one battery cell of the battery (as a safety variable) on the basis of the at least one safety-relevant operating variable ascertained for this battery cell, in particular, on the basis of the temperature, the voltage (or electrical variables linked thereto), a pressure, and/or the gas concentration of a decomposition gas. This history variable may reflect a preceding operating load (i.e., lying in the past) of the or the respective battery cell. For example, in particular, the curve of the respective operating variable over a time period between a preceding categorization and the present categorization is incorporated into this history variable.

In at least one disclosed method, the (so-called) Shannon entropy is ascertained as a safety variable, in particular, as the above-mentioned history variable, on the basis of the at least one safety-relevant operating variable ascertained for this battery cell, in particular, on the basis of the temperature (in particular, the "cell temperature"), the voltage, a pressure (in particular, the cell internal pressure), and/or the gas concentration of a decomposition gas. Optionally, for this purpose a data set—which may reflect the curve of the respective operating variable over the time period between the preceding categorization and the present categorization—is formed for each battery cell and each safety-relevant operating variable. Furthermore, multiple value ranges are associated with each operating variable used and the individual values of the respective operating variable are sorted into these value ranges. For example, four ranges are specified for the temperature, in particular, "range A" from a minimum value (for example, the lowest registered value or a producer-specific specified value) to 10 degrees Celsius, "range B" from 10 to 20 degrees Celsius, "range C" from 20 to 30 degrees Celsius, and "range D" from 30 degrees Celsius up to a maximum value. The number of the value ranges may be specified specifically by the producer in this case. Subsequently, optionally an occurrence probability is assigned to each value range, in particular, in that the number of the individual values in the respective value range is divided by the total number of all individual values of the respective data set. The Shannon entropy of the respective operating variable (in particular, of the observed physical variable) then results as $$E_i = -\sum_{j=1}^{n} \{p_j * \log_a(p_j)\} \quad (1)$$

in which
  i: is the number of the observed data set
  j: is the number of the observed value range
  n: is the number of the defined value ranges
  $p_j$: is the occurrence probability of the jth value range of the ith data set
  a: is the base of the logarithm (in particular, base 10, base 2, or base e is used).

Optionally, additionally or alternatively to the above-described Shannon entropy as a safety variable, in particular, as a history variable, at least one of the computed variables "state of health" or "state of power" can also be incorporated into the above-described safety consideration. The computed variable state of health may be formed here on the basis of one of the operating variables or a weighted combination of at least two of the operating variables internal resistance, internal impedance, internal conductivity, capacitance, voltage, self-discharge rate, number of cycles, operating duration of the battery, temperature of the battery cell, charging capacity, total charge throughput, total power throughput, and total energy throughput.

For the total charge throughput, the ascertainment of a state of health is described hereinafter as an example. This procedure can also be applied to the other mentioned operating variables, however. Multiple operating variables can additionally be taken into consideration here by a weighting function in the calculation of the state of health. For a constant current I over the time t, the following applies for the charge throughput Q:

$$Q = I * t \quad (2)$$

Since the current is not constant over time, the time-variable current i(t) has to be integrated over time (in particular, over the time period between preceding categorization and present categorization). To ascertain a total charge throughput, in addition both charging and also discharging currents have to be taken into consideration, because of which the absolute value of the time-variable currents is used:

$$Q = \int_{t1}^{t2} \{|i(t)|\} dt \quad (3)$$

By discretization into m sections, the following results:

$$Q = \sum_{k=1}^{m} \{|I_k| * t_i\} \quad (4)$$

Since high currents influence the state of health more strongly than low currents, the discretized total charge throughput is current-weighted via an exponent n. This exponent is ascertained empirically for a battery cell. Furthermore, division by the averaged current absolute value is performed, to obtain the unit of the charge throughput:

$$Q_{wt} = \sum_{k=1}^{m} \{I^* t_k / I_{avg}^{n-1}\} \quad (5)$$

For this purpose, the averaged current absolute value is calculated as:

$$I_{avg} = \sum_{k=1}^{m} \left\{ |I_k| * \frac{t_k}{t_{total}} \right\} \quad (6)$$

The State of Health ("SoH") now results from the formula:

$$SoH = (Q_{char} - Q_{wt}) * 100 / Q_{char} \quad (7)$$

wherein $Q_{char}$ represents the characteristic total charge throughput of the battery.

In addition, high temperatures influence the state of health more strongly than low temperatures. Therefore, it is derived in simplified form from the Arrhenius equation that the reaction speed (and thus also the aging) doubles upon a temperature increase by 10 K ("RGT rule"). Therefore, the weighted charge throughput is weighted in the formula for the state of health by the influence of the temperature according to the RGT rule and a defined reference temperature Tnom. In this case, Tnom represents the reference temperature at which the aging runs at the factor 1:

$$SoH = (Q_{char} - (2*(T/10 - T_{nom}/10) + 1)*Q_{wt})*100/Q_{char} \quad (8)$$

In an exemplary method, the total energy throughput is determined from a combination of the energy density of the battery cell and the number of cycles:

$$E_{tot} = w_{cell} * m_{cell} * n \quad (9)$$

$$E_{tot} = w_{cell} * V_{cell} * n \quad (10)$$

wherein $E_{tot}$ represents the total energy throughput, $w_{cell}$ represents the gravimetric or volumetric energy density of the cell, $m_{cell}$ represents the weight of the cell, $V_{cell}$ represents the volume of the cell, and n represents the number of cycles (n can also assume real values).

In particular, it is thus ascertained on the basis of the history variable whether, due to impermissible operating states which occurred during the prior operation of the or the respective battery cell, there is an indication against a safe further use of the corresponding battery cell, in particular, for a use in the transportation vehicle.

In at least one exemplary method, the failure prognosis is ascertained on the basis of a statistical model in the second operation for at least one battery cell of the battery by the lifetime-relevant operating variables. In this model, in particular, the operating variables operating duration of the battery cell, number of cycles of the battery cell, capacitance of the battery cell, quick-charged total amount of power, and/or mileage of the transportation vehicle comprising the battery are incorporated.

In at least one exemplary embodiment, the failure prognosis is ascertained specifically on the basis of a Weibull distribution in the second operation for at least one battery cell of the battery by the lifetime-relevant operating variables. In this Weibull distribution, in particular, the operating variables (specifically their presently ascertained values) operating duration of the battery cell, number of cycles of the battery cell, capacitance of the battery cell, quick-charged total amount of power, and/or mileage of the transportation vehicle comprising the battery are incorporated (and also related to corresponding characteristic or typical values for the variables). This adapted Weibull distribution describes the probability of a failure of a battery cell in percent.

Optionally, the (in particular, two-parameter) Weibull distribution is determined on the basis of the formula:

$$F(t, n, p, c) = 1 - e^{\left(\alpha*\left(\frac{[t-t0]}{[T-t0]}\right) + \beta*\left(\frac{[n-n0]}{[N-n0]}\right) + \gamma*\left(\frac{[p-p0]}{[P-p0]}\right) + \kappa*\left(\frac{[c-c0]}{[C-c0]}\right) + \upsilon*\left(\frac{[r-r0]}{[R-r0]}\right)\right)^b} \quad (11)$$

Wherein:
t: is the measured (i.e., in particular, presently accrued) operating duration of the battery cell, optionally since the last categorization, t0: is the initial operating duration of the battery cell at the beginning of the observations, i.e., in particular, at the point in time of the last categorization,
T: is the characteristic operating duration of the battery cell (specified by the producer in the context of the design, for example, T=5000 h for electric transportation vehicles),
n: is the measured (in particular, accrued) number of cycles of the battery cell,
n0: is the initial number of cycles of the battery cell at the beginning of the observations,
N: is the characteristic number of cycles of the battery cell (specified by the producer in the context of the design, for example, N=1000 for typical lithium-ion batteries),
c: is the measured capacitance of the battery cell,
c0: is the initial capacitance of the battery cell at the beginning of the observations,
C: is the characteristic capacitance of the battery cell (specified by the producer in the context of the design, for example, C=4500 mAh for typical lithium-ion batteries),
p: is the quick-charged total amount of power over the observed operating duration,
p0: is the initial quick-charged total amount of power at the beginning of the observations,
P: is the characteristic quick-charged total amount of power (specified by the producer in the context of the design),
r: is the measured (in particular, accrued) mileage of the transportation vehicle,
r0: is the mileage of the electric transportation vehicle upon the installation of the battery cell,
R: is the characteristic mileage of an electric transportation vehicle (specified by the producer in the context of the design),
$\alpha, \beta, \gamma, \kappa, \upsilon$: are defined weighting factors for the various design parameters,
b: is the form factor of the Weibull distribution (for the observation of early failures, a form parameter b<1 is selected. For the observation of random failures, a form parameter b=1 is selected, which stands, in particular, for a constantly assumed failure rate. For wear and fatigue failures, a form parameter b>1 is selected.).

The total amount of power p may be ascertained in the above embodiment on the basis of $$p = \int_{t1}^{t2} \{|i(t)| * u(t)\} dt \quad (12)$$

In particular, ascertained similarly to the total amount of charge, wherein u(t) describes the time-variable voltage.

In that statistical methods are used for categorization in the first operation and the second operation, the statements which can thus be made are comparatively reliable.

In at least one exemplary embodiment, the failure prognosis, ascertained on the basis of the above-described Weibull distribution, of the or the respective battery cell is assigned on the basis of its numeric value to a value range of the categorization variable.

The categorization variable may be assigned here at least the value ranges "like new" (for example, for a failure prognosis of 0 to 5%; a use in the transportation vehicle is readily possible), "vehicle use" (for example, for a failure prognosis of 5 to 35%; indicates that the battery is used but is still to be used for a transportation vehicle), "second use"

(or also "industrial grade"; for example, for a failure prognosis of 35 to 60%; indicates that a use downstream of the main intended use is to be recommended), and "recycling" (also: "recycling grade"; for example, for a failure prognosis of 60 to 100%; indicates that the battery is to be supplied to the material utilization). These value ranges or "categories" therefore indicate the handling suitability of the battery. Optionally, corresponding recommendations or suggestions for further handling are also indicated to the user of the battery, for example, "unrestricted use of the battery in the vehicle possible", "replacement of the battery recommended, subsequent use of the battery possible", or "replacement of the battery and supply to recycling recommended".

In an alternative exemplary embodiment to the above-described application of the Weibull distribution, the failure prognosis is prepared in that error density functions are initially statistically determined on the basis of tests for battery cells of a production unit (also: "batch" or "lot"). These error density functions are "clarified" at least in sections by a Weibull distribution, i.e., in particular, mapped so that error rates for battery cells can be derived (in particular, by section), which are chronologically variable depending on the type of failure (early failure, random failure, aging failure) or, in particular, in the case of random failures, are chronologically constant. Optionally, these error rates ascertained in this way are subsequently either combined (in particular, in weighted form) or used individually as parameters in a description model for the battery cells (optionally for the battery module formed therefrom and/or for the traction battery in turn comprising this module). For example, reliability graphs, Markov chains, or the like are used as description models. From the description model parameterized in this way, at least one characteristic value for the reliability and/or for the failure probability of the respective battery cell (or the battery module or the traction battery, respectively) is subsequently derived. This characteristic value or these characteristic values represent, in particular, the above-described failure prognosis. In particular, the above-mentioned lifetime-relevant operating variables (optionally the presently registered values thereof), optionally operating duration of the battery cell, number of cycles of the battery cell, capacitance of the battery cell, quick-charged total amount of power, and/or mileage of the transportation vehicle comprising the battery are also supplied as input variables to the description model. As already described above, the ascertained failure prognosis of the or the respective battery cell is also assigned on the basis of its numeric value to the corresponding value range of the categorization variable.

Optionally—for example, after release by the user or service personnel—a preparation of the battery for the subsequent use or the recycling takes place, in particular, by corresponding measures stored in the battery management system and/or the database. This preparation comprises, for example, discharging the battery to a respectively specified "residual value", temperature control to a predetermined temperature value, and/or the like. In particular, the battery management system is also configured to open (high-voltage) contactors between the battery and consumers, in particular, the "vehicle electrical system" in the transportation vehicle, for example, downstream controllers and at least one electric motor, before initiating such operations.

In at least one exemplary method, at least one battery cell is assigned on the basis of special events registered in operation of the battery, which make recycling impossible, the special category "hazardous waste". This is the case, for example, if complete thermal damage, mechanical damage exceeding a limiting value (therefore "serious" damage), or the like was established for the corresponding battery cell.

Optionally, the categorization of the battery (or the respective battery cell) described here and in the following takes place at predetermined intervals and/or at individually selectable points in time. In the latter case, for example, the categorization can be triggered in the context of a vehicle service by the service personnel.

In a further exemplary method, which is applied for the case in which the battery as described above comprises multiple battery cells assembled into at least one battery module (optionally also multiple battery modules), the categorization variable is ascertained for at least multiple, optionally for all of these battery cells. Subsequently, optionally a module categorization variable and a battery categorization variable are ascertained on the basis of the individual categorization variables for the battery cells.

Optionally, the "individual" Shannon entropy is ascertained as above by formula (1) for each or at least some of the battery cells. Subsequently, the arithmetic mean value is derived therefrom:

$$E = \sum_{i=1}^{m} \{E_i/m\} \tag{13}$$

In this case:
i: is the number of the observed Shannon entropy
$E_i$: is the Shannon entropy of the ith data set of an observed physical variable
m: is the number of all data sets.

In particular, the standard deviation of all Shannon entropies of the data sets (registered for an observation time period) is determined therefrom:

$$\sigma_E = \sqrt{\left(\frac{1}{m} - \sum_{i=1}^{m} \{E_i - E\}^2\right)} \tag{14}$$

Subsequently, a so-called abnormality coefficient Ai of each individual data set may be derived therefrom:

$$A_i = |E_i - E|/\sigma_E \tag{15}$$

The abnormality coefficient represents a measure of by how many standard deviations a Shannon entropy deviates from the mean value of all Shannon entropies. This abnormality coefficient and optionally additionally or alternatively the standard deviation is or are used to ascertain statistical outliers in the measurement data of an observed physical variable with comparatively little effort and also to exclude them from the above-described observation.

Optionally, a percentage distribution of the individual categories over the respective battery module and/or the battery is formed from the individual categorization variables of the battery cells. This distribution thus specifies what percent of battery cells suitable for further transportation vehicle use, available for the second use, and to be recycled the respective battery module or the battery includes. This distribution is optionally compared in turn to a limiting distribution and categorized on the basis of this comparison. For example, a small percentage of battery cells available for the second use is accepted for a further transportation vehicle use.

Further optionally, a number of warning messages occurring in operation are additionally taken into consideration—in particular, in weighted form—in the categorization of the battery modules or the entire battery. For example, the weighting can increase here with increasing categories deviating from the vehicle use, in particular, "worse" categories in the battery module or the battery, so that therefore in the case of a distribution tending increasingly toward a second use of the individual "cell categories" ever fewer warning messages are sufficient to set the "overall category" of the battery (or the battery module) to a "worse" category, i.e., for example, from vehicle use to second use.

In a further exemplary method, specific items of information about production and/or structure of the at least one included battery cell, about limits of safety-relevant and/or lifetime-relevant operating variables, and/or about measures for initiating a downstream use and/or utilization are assigned to the battery. These items of information may be stored after the production, in particular, at the producer in the above-described database and/or the battery management system. In particular, to be able to retrieve these items of information in a simple manner during the installation of the battery, optionally also during its production from the or multiple battery cells, the respective battery cell, a battery module formed from multiple battery cells, and/or also the battery itself is provided with a barcode which contains these items of information and/or a link to the database to retrieve these items of information.

For example, these items of information comprise specifications about the cell identification number and possibly the module identification number, the battery identification number, and optionally also the transportation vehicle identification number, the cell chemistry used for the battery cell, an identification number of the producer, a specified permitted (or: "characteristic") number of cycles specified by the producer in each case for a first use, second use, and reaching the end-of-life ("usage end") of the respective battery cell, a permitted range (mileage) specified by the producer for the first use as a transportation vehicle battery, a permitted operating duration specified by the producer for the first use, second use, and reaching the end-of-life (either as a total operating duration or as separate specifications for storage, idle, and usage times), a permitted charge throughput specified by the producer or a capacitance for the first use, second use, and reaching the end-of-life, recycling methods to be applied (for example, recycling operation or recycling methods), notifications of hazardous materials, a permitted total energy throughput specified by the producer for the first use, second use, and reaching the end-of-life, a permitted total power throughput specified by the producer for the first use, second use, and reaching the end-of-life, a permitted operating duration specified by the producer outside the permitted operating voltage window and/or outside the permitted operating temperature window of the battery cell for the first use, second use, and reaching the end-of-life, discharge methods to be applied before starting the recycling, a nominal weight of the battery cell, and/or a production or formation date.

The disclosed battery is configured and provided for use in a transportation vehicle (optionally also an electric bike, a scooter, a water vehicle, or the like). The battery includes in this case—as already described above—at least one battery cell (optionally multiple battery cells assembled into battery modules) and a battery management system. The latter is configured, in operation of the battery, to register a number of safety-relevant and lifetime-relevant operating variables for at least one battery cell of the battery and to provide them to a controller of the battery management system and/or the above-described external database (in particular, to the battery or the transportation vehicle) to carry out the above-described method.

In at least one exemplary embodiment, the battery management system, in particular, its controller, is configured to exclude individual battery cells or battery modules, which are no longer suitable according to the above-described categorization for further vehicle use, from the cell strand of multiple battery cells in a battery module or module strand of multiple battery modules. For this purpose, the battery is equipped with corresponding switch devices, To be able to separate individual battery cells or battery modules from the corresponding circuit. In this case, the battery is thus "reconfigured".

In a further exemplary embodiment, the battery management system, in particular, for the case in which the items of information are transmitted to the external database, is configured to transmit the present operating variables and variables derived therefrom for update to the database. In particular, in this case the present categorization variable, in particular, its distribution, identification features such as the transportation vehicle identification number or module identification number, the present number of cycles, the present mileage, the present charge throughput and/or the present capacitance, the present operating duration, present times outside specified operating windows (e.g., voltage window, temperature window, discharge current window), the type and number of occurring warning messages and/or vehicle status messages with safety reference to the battery (e.g., accident data, crash data, propagation warnings, overheating warnings, deep discharge warnings, overcharge warnings, overcurrent warnings, EMC warnings, etc.), the point in time of the next categorization, the present total energy throughput, the present total power throughput, and/or the present number of the quick charge processes are transmitted. These variables are also required for the categorization on the part of the database. The battery management system is also optionally configured to retrieve the characteristic operating variables, i.e., in particular, operating variables specified as characteristic for the respective battery at the producer (i.e., their characteristic values) from the database for the respective categorization.

The disclosed battery utilization system comprises the above-described database, which contains the battery-specific items of information about production and/or structure of the at least one battery cell contained in the battery, about limits of safety-relevant and/or lifetime-relevant operating variables, and/or about measures for initiating a downstream use and/or utilization (from the main or first use, in particular, in the transportation vehicle) of the battery cell. In particular, these items of information are supplied as described above to the database. The database is additionally configured to receive a number of safety-relevant and lifetime-relevant operating variables for the at least one battery cell of the battery from the battery management system of the battery and to carry out the above-described method, in particular, automatically.

In at least one exemplary embodiment, the database is configured to judge, on the basis of the supplied items of information, measures for initiating a downstream use and/or utilization of multiple batteries with respect to effort and costs and to prepare a capacity plan for units for use and/or utilization on the basis of this judgment. It is thus ascertained, for example, how many different batteries having a comparable category distribution, chemical composition, and the like are stored in the database and are available for further handling. The database is configured in this case for the purpose of also grouping the categorized batteries with respect to their properties and further handling, and to transmit the corresponding group information—in particular, for better capacity planning in recycling companies and/or repair shops for refitting the batteries for the second use—for example, to the recycling company closest in position to the groups or at least responsible, the closest responsible repair shop, or the like.

In addition, the database is optionally also configured to ascertain, on the basis of the above-described groups, optionally occurring recycling and/or hazardous waste volumes, utilization or disposal costs, and the like.

Furthermore, the database is also expediently configured, for example, upon arrival of a transportation vehicle including a battery to be recycled in a recycling company, to transmit items of information about the recycling operation required for the specific battery to an—optionally automated—recycling machine.

The disclosed transportation vehicle comprises the above-described battery.

Figure 4:
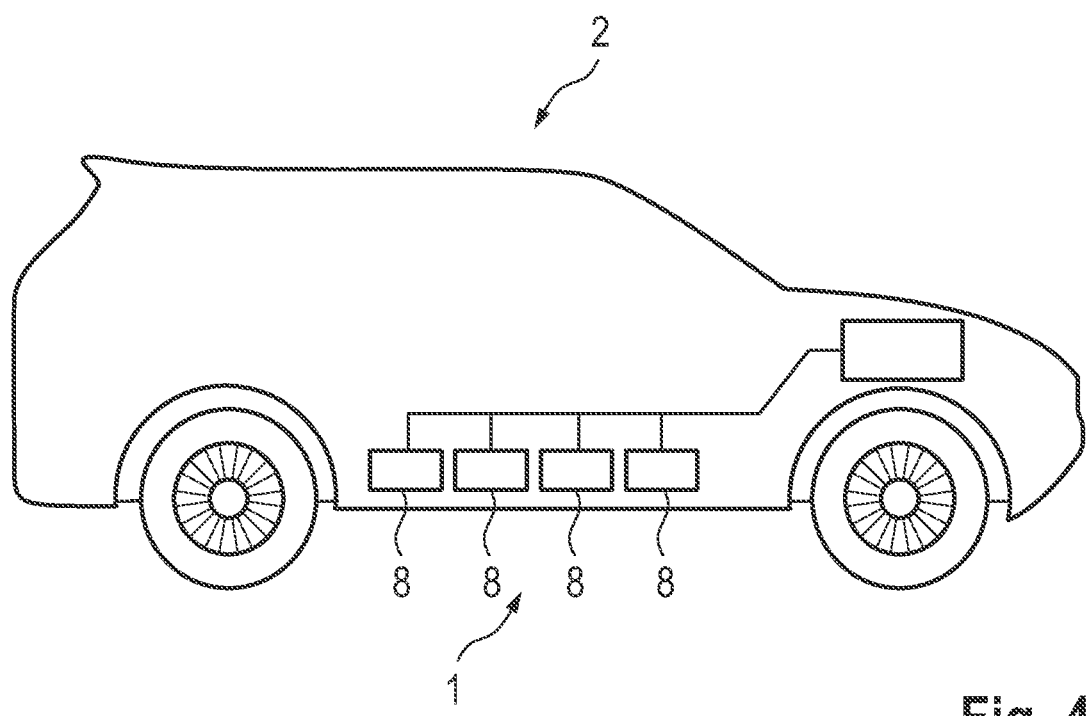
FIG. 4 shows a schematic view of a transportation vehicle having the battery.

A traction battery, also referred to as a battery pack, in short as "battery 1", of a transportation vehicle 2 (see FIG. 4) is illustrated in FIG. 1. The battery 1 comprises multiple individual battery cells, which are designed as secondary cells (i.e., as rechargeable battery cells) and are referred to in short as "cells 4". The cells 4 are arranged in multiples in a common module housing 6 and are thus assembled to form a battery module 8. An interconnection of the individual cells 4 with one another is not illustrated in greater detail. The battery 1 comprises a battery housing 10, in which in turn multiple of the battery modules 8 are arranged and also interconnected with one another in a way not illustrated in greater detail.

To ascertain present operating variables of each cell 4, a sensor unit 12 is assigned to each of them. These are configured to register a present temperature T of the respective cell 4, the present pressure within the cell 4, and optionally also a gas concentration of a decomposition gas of media contained in the respective cell 4. A sampling rate of approximately 1/30 Hz is sufficient here. The resolution of the individual sensor signals is to be in the range of 1 K, 10 kPa, or 1 ppm dissolved gas.

The battery 1 additionally also comprises a battery management system 14, which forms a controller, which is configured, inter alia, to ascertain electric operating variables of the individual cells 4, namely the present voltage (optionally at a resolution of 1 V), the charging and discharging currents, a total charge throughput QG, a present (storage) capacitance c, and other operating variables such as the accrued operating duration of the respective cell, a number of charging cycles n carried out, a quick-charged total amount of power, a present mileage r of the transportation vehicle 1, and the like.

In addition, the battery management system 14 is configured to automatically carry out a method for categorizing the battery 1 with respect to its further handling suitability. For this purpose, the battery management system 14 ascertains, on the basis of the data of the respective sensor unit 12 and on the basis of the present voltage over a predetermined period of time, the Shannon entropy for each operating variable and for each cell 4 in a first evaluation operation.

If one of the Shannon entropies exceeds a predetermined threshold value, the battery management system 14 outputs the category "recycling grade" for this cell 4 and terminates the further evaluation for this cell 4.

If all Shannon entropies fall below the respective threshold value, the battery management system 14 passes over to a second evaluation operation. In this second evaluation operation, the battery management system 14 ascertains a Weibull distribution for each cell by the accrued operating duration, the accrued number of charging cycles, the present and the original capacitance, the accrued quick-charged total amount of power, and the accrued mileage. The respective parameters are set here in relation to their characteristic (i.e., to be expected in the case of intended use) value (assigned specifically by producer).

The Weibull distribution of each cell 4 specifies a failure prognosis, i.e., a failure probability (in percentage). Subsequently, categories which relate to value ranges of the Weibull distribution are assigned on the basis of a predetermined pattern. These categories specify whether the respective cell 4 is (nearly) like new, is suitable for further use in the transportation vehicle 2 ("automotive grade"), is to be recommended for a second use (for example, in industry as a buffer) ("industrial grade"), or is to be supplied to material utilization ("recycling grade").

On the basis of the categories of the individual cells 4, the battery management system 14 prepares a category distribution of the battery modules 8 and the battery 1 on the basis of which it is in turn judged, specifically on the basis of a threshold value comparison, whether only one battery module 8 or the entire battery 1 is to be replaced.

Figure 2:
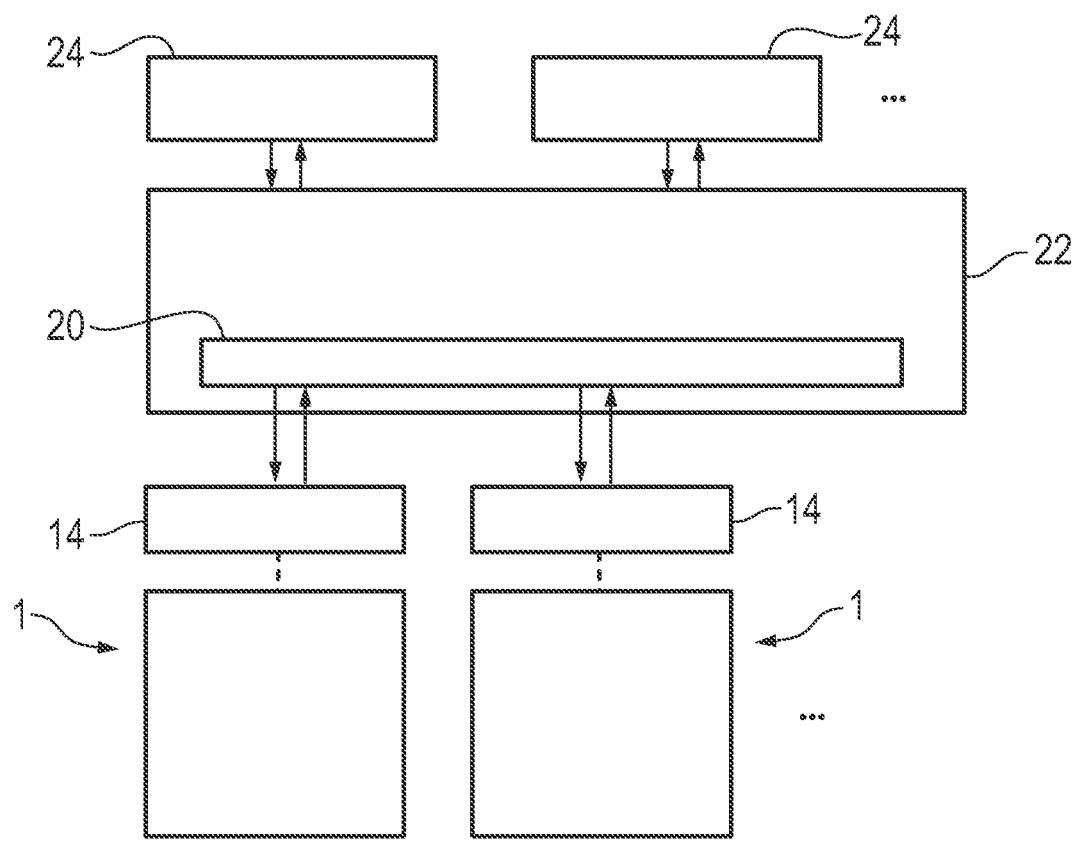
FIG. 2 shows a schematic view of a diagram of an information flow of data between a plurality of batteries and a database.

For redundancy or outsourcing of the registered operating variables and optionally also the categorization, the battery management system 14 is configured to transmit the above-described sensor data and operating variables and optionally also the categories of the cells 4 to a database 20 (see FIG. 2). This database 20 is implemented here on a server 22, which is accessible to multiple battery management systems 14 and can thus bundle the items of information of multiple batteries 1. "Clients 24" are in turn in communicative connection with this server 22, which will be described in greater detail hereinafter.

To be able to link the items of information of a specific battery 1 for the first time with an entry saved by the producer in the database 20 or be able to transmit the items of information for storage to the database 20 in a simple manner, the respective cells 4, the battery modules 8, and the battery 1 are each assigned barcodes 30, which contain a link to the corresponding database entry. This database entry contains items of information about the above-mentioned characteristic values of the operating variables required for the categorization, items of information about the cell chemistry used, production date and production company, and the like. In addition, the database entry contains the categories as described above continuously updated—ascertained on the part of the database 20 or transmitted to the database 20 after ascertainment by the battery management system 14.

The database 20 is additionally configured to estimate, on the basis of the categorization of multiple batteries 1, the volume of cells 4 for a second use, for material utilization and possibly, as no long suitable for recycling, for landfill or other final disposal, and also the costs to be expected for this.

The server 22 having the database 20 forms a battery utilization system, by which the handling suitability (which results from the respective category) of batteries 1 is registered.

Figure 3:
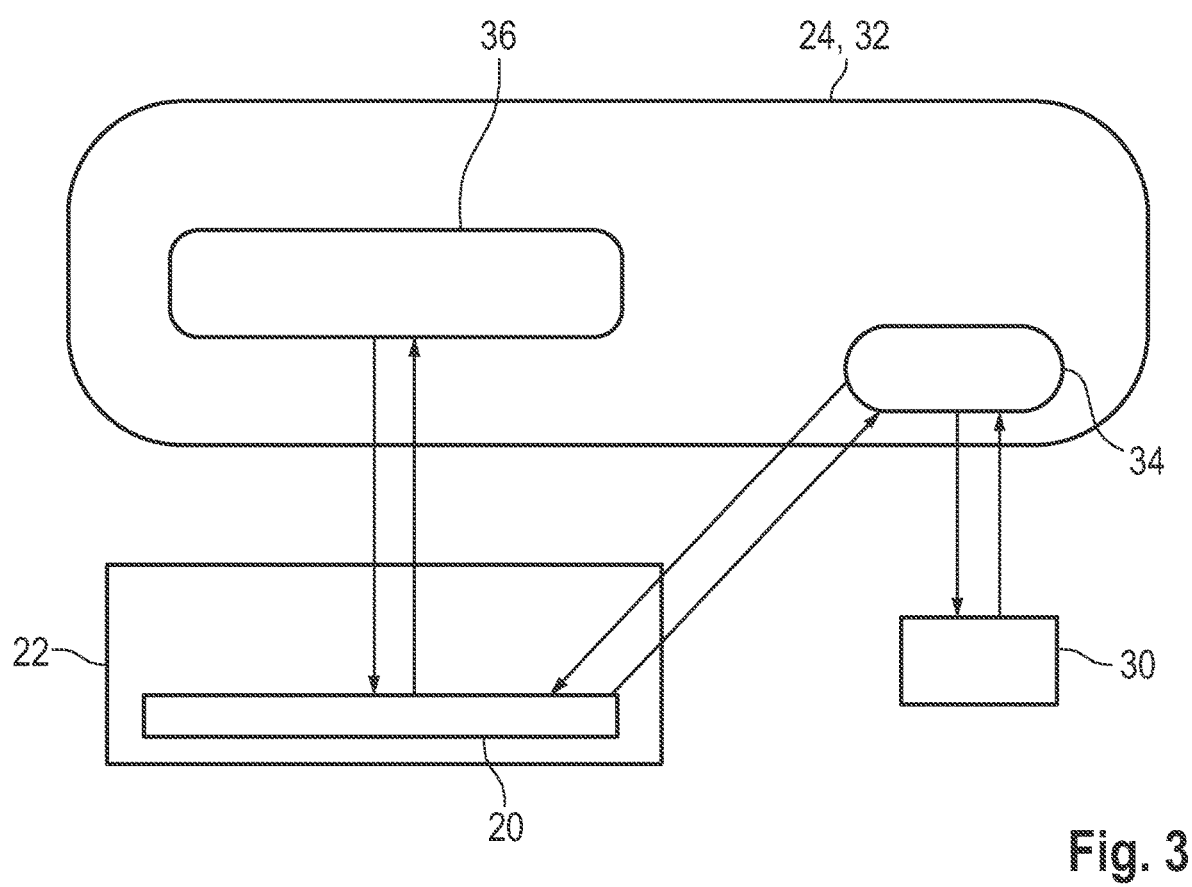
FIG. 3 shows a schematic view of a diagram of an information flow between the database and a recycling location for batteries.

If it is ascertained for the battery 1 of a specific transportation vehicle 1 that the battery 1 is to be supplied to recycling, a corresponding item of information is output to the user of the transportation vehicle 1 (triggered by the database 20 or the battery management system 14). This transportation vehicle can then drive to a repair shop, for example, to have the battery 1 removed and possibly replaced. If the battery 1 is supplied to a recycling business 32, which represents one of the clients 24 (see FIG. 3), items of information about the battery 1 and the process of the utilization required for the specific battery 1 can be retrieved there from the database 20 by a scanner 34 by the respective barcode 30 of the battery 1 or the cells 4 or the battery modules 8. The database 20 transmits these items of information, for example, to a recycling machine 36 of the recycling business 32 or at least to a server there. The process sequence for recycling is frequently dependent here on the specific cell chemistry and the structure of the respective cell 4.

Since the items of information about multiple batteries 1 are provided centrally in the database 20, it is also possible and provided that capacity planning of recycling businesses 32 is performed by the database 20, for example, by supplying equivalent batteries 1 for utilization to different recycling businesses 32, so that the same utilization process sequences can take place for a plurality of batteries 1, without having to reconfigure recycling machines 36 or the like again and again for different battery types.

The disclosure is not restricted to the above-described exemplary embodiments. Rather, further embodiments can be derived by a person skilled in the art from the above description. In particular, the individual features described on the basis of the various exemplary embodiments and their embodiment options can also be combined with one another in another way.

LIST OF REFERENCE NUMERALS 1 battery
2 transportation vehicle
4 cell
6 module housing
8 battery module
10 housing
12 sensor unit
14 battery management system
20 database
22 server
24 client
30 barcode
32 recycling business
34 scanner
36 recycling machine

The invention claimed is:

1. A battery for a transportation vehicle, the battery comprising:
at least one battery cell; and
a battery management system including a controller and being programmed to manage battery operation by determining a categorization variable using a two-operation evaluation of at least one of operating variables and/or of a computed variable derived therefrom, wherein the operating variables include a plurality of safety and lifetime operating variables of at least one battery cell of the battery registered by the battery management system and/or an external database, wherein the battery management system categorizes the battery with respect to further handling based on the registered plurality of safety and lifetime operating variables,
wherein the two-operation evaluation includes a first operation wherein:
at least one safety operating variable is derived and compared to an assigned threshold value;
a failure prognosis is prepared for a plurality of the lifetime operating variables in response to the at least one safety operating variable falling below the threshold value or one of multiple threshold values;
the categorization variable is determined based on the prepared failure prognosis; and
a history variable is determined for at least one battery cell of the battery based on the at least one safety operating variable determined for the at least one battery cell, wherein the history variable indicates a preceding operating load of the at least one battery cell; and
wherein a second operation of the two-operation evaluation includes:
determination of the failure prognosis performed using the lifetime operating variables based on a statistical model for at least one battery cell of the battery that incorporates the operating variables including operating duration of the battery cell, number of cycles of the battery cell, capacitance of the battery cell, quick-charged total amount of power, and/or mileage of a transportation vehicle that includes the battery;
assignment of the failure prognosis to a value range of the categorization variable based on a numerical value of the failure prognosis, wherein the categorization variable is assigned to a value range indicative of further use of the battery; and
indication of recommendations or instructions for further handling of the battery.

2. The battery of claim 1, wherein at least one battery cell is assigned the special category "hazardous waste" based on an event registered in operation of the battery, wherein the category "hazardous waste" indicates that recycling of the at least one battery cell is impossible.

3. The battery of claim 1, further comprising a plurality of battery cells including the at least one battery cell, wherein the plurality of battery cells is assembled into at least one battery module, wherein determination of the categorization variable is performed for at least two of the plurality of the battery cells, and wherein a module categorization variable and a battery categorization variable are determined based on the determined categorization variables for the at least two battery cells.

4. The battery of claim 1, wherein the battery is assigned specific items of information about production and/or structure of the at least one included battery cell, about limits of safety and/or lifetime operating variables, and/or about measures for initiating a downstream use and/or utilization.

5. A transportation vehicle comprising the battery of claim 1.

6. A battery management system comprising:
a database containing battery-specific items of information indicating production and/or structure of at least one battery cell contained in a battery, limits of safety and/or lifetime operating variables and/or measures for initiating a downstream use and/or utilization of the at least one battery cell and
a controller,
wherein the database receives a plurality of safety and lifetime operating variables for at least one battery cell of the battery from the controller and is programmed to manage battery operation by determining a categorization variable using a two-operation evaluation of at least one of the operating variables and/or of a computed variable derived therefrom, wherein the operating variables include a plurality of safety and lifetime operating variables of at least one battery cell of the battery registered by the battery management system and/or an external database, wherein the battery management system categorizes the battery with respect to further handling based on the plurality of safety and lifetime operating variables, wherein the two-operation evaluation includes a first operation wherein:
- at least one safety operating variable is derived and compared to an assigned threshold value;
- a failure prognosis is prepared for a plurality of the lifetime operating variables in response to the at least one safety operating variable falling below the threshold value or one of multiple threshold values;
- the categorization variable is determined based on the prepared failure prognosis; and
- a history variable is determined for at least one battery cell of the battery based on the at least one safety operating variable determined for the at least one battery cell, wherein the history variable indicates a preceding operating load of the at least one battery cell; and wherein a second operation of the two-operation evaluation includes:
- determination of the failure prognosis performed using the lifetime operating variables based on a statistical model for at least one battery cell of the battery that incorporates the operating variables including operating duration of the battery cell, number of cycles of the battery cell, capacitance of the battery cell, quick-charged total amount of power, and/or mileage of a transportation vehicle that includes the battery;
- assignment of the failure prognosis to a value range of the categorization variable based on a numerical value of the failure prognosis, wherein the categorization variable is assigned to a value range indicative of further use of the battery; and
- indication of recommendations or instructions for further handling of the battery.

7. The battery management system of claim 6, wherein a capacity plan is prepared for units for use and/or utilization based on measures for initiating a downstream use and/or utilization of multiple batteries with respect to effort and costs based on the battery-specific items of information.

8. A method for categorizing a battery with respect to its further handling, the method comprising:

determining a categorization variable using a two-operation evaluation of at least one of the operating variables and/or of a computed variable derived therefrom, wherein the operating variables include a plurality of safety and lifetime operating variables of at least one battery cell of the battery registered by a battery management system and/or an external database, wherein the battery management system categorizes the battery with respect to further handling based on the plurality of safety and lifetime operating variables, wherein the two-operation evaluation includes a first operation wherein:
- at least one safety operating variable is derived and compared to an assigned threshold value;
- a failure prognosis is prepared for a plurality of the lifetime operating variables in response to the at least one safety operating variable falling below the threshold value or one of multiple threshold values;
- the categorization variable is determined based on the prepared failure prognosis; and
- a history variable is determined for at least one battery cell of the battery based on the at least one safety operating variable determined for the at least one battery cell, wherein the history variable indicates a preceding operating load of the at least one battery cell; and wherein a second operation of the two-operation evaluation includes:
- determination of the failure prognosis performed using the lifetime operating variables based on a statistical model for at least one battery cell of the battery that incorporates the operating variables including operating duration of the battery cell, number of cycles of the battery cell, capacitance of the battery cell, quick-charged total amount of power, and/or mileage of a transportation vehicle that includes the battery;
- assignment of the failure prognosis to a value range of the categorization variable based on a numerical value of the failure prognosis, wherein the categorization variable is assigned to a value range indicative of further use of the battery; and
- indication of recommendations or instructions for further handling of the battery.

9. The method of claim 8, wherein at least one battery cell is assigned the special category "hazardous waste" based on an event registered in operation of the battery, wherein the category "hazardous waste" indicates that recycling of the at least one battery cell is impossible.

10. The method of claim 8, wherein a plurality of battery cells including the at least one battery cell, wherein the plurality of battery cells is assembled into at least one battery module, wherein determination of the categorization variable is performed for at least two of the plurality of the battery cells, and wherein a module categorization variable and a battery categorization variable are determined based on the determined categorization variables for the plurality of battery cells.

11. The method of claim 8, wherein the battery is assigned specific items of information about production and/or structure of the at least one included battery cell, about limits of safety and/or lifetime operating variables, and/or about measures for initiating a downstream use and/or utilization.

* * * * *